US011915879B2

(12) United States Patent
Okada et al.

(10) Patent No.: US 11,915,879 B2
(45) Date of Patent: Feb. 27, 2024

(54) ELECTRONIC COMPONENT, CIRCUIT BOARD ARRANGEMENT AND METHOD OF MANUFACTURING ELECTRONIC COMPONENT

(71) Applicant: TAIYO YUDEN CO., LTD., Tokyo (JP)

(72) Inventors: Anju Okada, Tokyo (JP); Mina Amano, Tokyo (JP); Kiyoshiro Yatagawa, Tokyo (JP); Takahisa Fukuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 5 days.

(21) Appl. No.: 17/331,552

(22) Filed: May 26, 2021

(65) Prior Publication Data

US 2021/0375549 A1    Dec. 2, 2021

(30) Foreign Application Priority Data

Jun. 1, 2020    (JP) .................................. 2020-095332

(51) Int. Cl.
*H01G 4/30* (2006.01)
*H01G 4/012* (2006.01)
(Continued)

(52) U.S. Cl.
CPC ............... *H01G 4/30* (2013.01); *H01G 4/012* (2013.01); *H01G 4/1227* (2013.01);
(Continued)

(58) Field of Classification Search
CPC ...... H01G 4/012; H01G 4/1227; H01G 4/232; H01G 4/248; H01G 4/30; H05K 1/181; H05K 2201/10015
See application file for complete search history.

(56) References Cited

U.S. PATENT DOCUMENTS 10,361,035 B1    7/2019 Song et al.
2007/0242416 A1   10/2007 Saito et al.
(Continued)

FOREIGN PATENT DOCUMENTS

JP    2000-277370 A    10/2000
JP    2007-281400 A    10/2007
(Continued)

OTHER PUBLICATIONS

Office Action dated Dec. 29, 2021 in U.S. Appl. No. 17/331,559, which has been cross-referenced to the instant application.
(Continued)

*Primary Examiner* — Nathan Milakovich
(74) *Attorney, Agent, or Firm* — CHEN YOSHIMURA LLP

(57) ABSTRACT

An electronic component includes an element body and at least one external electrode thereon. The element body has a dielectric and inner electrodes. Each external electrode includes a base layer connected to at least one the inner electrode. The base layer is formed on a plurality of surfaces of the element body and contains a metal and a first co-material mixed with the metal. Each external electrode also includes a plating layer formed on at least one face of the base layer. Each external electrode also includes an oxide layer formed on one or more faces of the base layer other than those faces of the base layer on which the plating layer is formed. The oxide layer has a surface layer made from an oxide film of the metal of the base layer and a second co-material.

17 Claims, 14 Drawing Sheets

(51) Int. Cl.
*H01G 4/12* (2006.01)
*H01G 4/248* (2006.01)
*H05K 1/18* (2006.01)

(52) U.S. Cl.
CPC ............. *H01G 4/248* (2013.01); *H05K 1/181* (2013.01); *H05K 2201/10015* (2013.01)

(56) References Cited

U.S. PATENT DOCUMENTS

| | | |
|---|---|---|
| 2011/0300307 A1 | 12/2011 | Nakai et al. |
| 2014/0041913 A1 | 2/2014 | Yanagida et al. |
| 2014/0041930 A1* | 2/2014 | Yanagida ................. H05K 7/00 174/549 |
| 2015/0364253 A1 | 12/2015 | Arnold et al. |
| 2019/0164693 A1 | 5/2019 | Ono et al. |
| 2021/0045227 A1 | 2/2021 | Mayr |
| 2021/0125783 A1 | 4/2021 | Onodera et al. |
| 2021/0265114 A1 | 8/2021 | Park et al. |
| 2021/0327648 A1* | 10/2021 | Kanzaki ................ H01G 4/2325 |
| 2021/0375550 A1 | 12/2021 | Yatagawa et al. |
| 2022/0301778 A1* | 9/2022 | Suga ....................... H05K 1/181 |
| 2022/0301779 A1* | 9/2022 | Take .................... H01G 4/2325 |
| 2022/0301781 A1* | 9/2022 | Takei ..................... H01G 2/065 |

FOREIGN PATENT DOCUMENTS

| | | |
|---|---|---|
| JP | 2014-053598 A | 3/2014 |
| JP | 2014-053599 A | 3/2014 |

OTHER PUBLICATIONS

U.S. Appl. No. 17/331,559, filed May 26, 2021.

Office Action dated Sep. 7, 2022 in U.S. Appl. No. 17/331,559, which has been cross-referenced to the instant application.

Japanese Office Action dated Jan. 9, 2024, in a counterpart Japanese patent application No. 2020--095332. (A machine translation (not reviewed for accuracy) attached.).

\* cited by examiner

ELECTRONIC COMPONENT, CIRCUIT BOARD ARRANGEMENT AND METHOD OF MANUFACTURING ELECTRONIC COMPONENT

FIELD OF THE INVENTION

The present invention relates to an electronic component, a circuit board arrangement, and a method of manufacturing the electronic component.

DESCRIPTION OF THE RELATED ART

In order to reduce a mounting area of an electronic component with a demand for downsizing of an electronic device, an external electrode is often formed on an element body in which an internal electrode is provided. The external electrode is connected to a circuit board by soldering such that an electronic component is mounted on the circuit board.

The external electrode may be formed not only on the mounting surface of the element body, but also on the side surface and the upper surface of the element body. In this configuration, the wet solder may move upward along the side surface of the external electrode and increase the mounting area.

To prevent the wet solder from moving upward along the side surface of the terminal electrode, JP-2014-53599A discloses a configuration in which the side surface portions of the first and second terminal electrodes, which are formed on the side surface of the electronic component, are covered with an oxide film.

SUMMARY OF THE INVENTION

However, if the side surface portion of the terminal electrode is covered with the oxide film, and a mechanical stress is applied to the oxide film, the oxide film may peel along the interface between the terminal electrode and the oxide film. The oxide film may suddenly peel from a large area of the terminal electrode.

One object of the present invention is to provide an electronic component in which an oxide layer formed on an external electrode is difficult to peel from the external electrode. Another object of the present invention is to provide a method of manufacturing such electronic component. Still another object of the present invention is to provide a circuit board arrangement in which an oxide layer formed on an external electrode of an electronic component mounted on a circuit board is difficult to peel from the external electrode.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides an electronic component that includes an element body and at least one external electrode. The element body has a dielectric and an inner electrode. Each external electrode includes a base layer connected to the inner electrode. The base layer is formed on a plurality of surfaces of the element body, and contains a metal and a first co-material mixed with the metal. Each external electrode also includes a plating layer formed on at least one surface of the base layer. Each external electrode also includes an oxide layer formed on one or more surfaces of the base layer other than those surfaces of the base layer on which the plating layer is formed. The oxide layer has a surface layer made from an oxide film of the metal of the base layer and a second co-material.

The first co-material contained in the base layer and the second co-material contained in the oxide layer may have a same composition.

A main component of the dielectric may be oxide ceramic.

The first co-material contained in the base layer and the second co-material contained in the oxide layer may have a same composition as a main component of the dielectric.

The first co-material may be continuous to the second co-material from the base layer to the oxide layer, and the first co-material and the second co-material may have a continuous crystal structure or amorphous structure.

The metal of the base layer may be present in the form of crystalline or amorphous particles and the first co-material may also present in the form of crystalline or amorphous particles such that the particles of the metal of the base layer are mixedly present with the particles of the first co-material.

The main component of the dielectric may be barium titanate.

The oxide layer may be provided on at least a portion of a side surface of the base layer and a surface opposite to the surface on which the plating layer is formed.

A ratio of the second co-material at the surface of the oxide layer may be 20 at % to 75 at %.

The metal of the base layer may be a metal or alloy containing at least one selected from Cu, Fe, Zn, Al, Ni, Pt, Pd, Ag, Au and Sn.

The first co-material may be selected from at least one of barium titanate, strontium titanate, calcium titanate, magnesium titanate, barium strontium titanate, barium calcium titanate, calcium zirconate, barium zirconate, calcium titanate zirconate and titanium oxide.

The oxide layer may include nickel oxide and barium titanate when viewed from a surface of the oxide layer.

The oxide layer may further include a compound containing nickel, magnesium, and oxygen when viewed from the surface of the oxide layer.

The element body may have a laminate, in which at least one first inner electrode layer and at least one second inner electrode layer are alternately laminated via the dielectric. The above-mentioned at least one external electrode may include a first external electrode and a second external electrode provided on opposite side surfaces of the laminate such that the first external electrode is spaced from the second external electrode. The first inner electrode layer(s) may be connected to the first external electrode, and the second inner electrode layer(s) may be connected to the second external electrode.

The plating layer may be formed on one of surfaces of the base layer which extend perpendicularly to a direction of lamination of the first inner electrode layer(s), the second inner electrode layer(s) and the dielectric.

According to a second aspect of the present invention, there is provided a circuit board arrangement in which the above-described electronic component is mounted on a circuit board, and the electronic component is connected to the circuit board via a solder layer attached to a plating layer of the electronic component.

According to a third aspect of the present invention, there is provided a method of manufacturing an electronic component. The method includes forming an element body which includes a dielectric and an inner electrode. The method also includes applying a mixed material, which is obtained by mixing a co-material with an electrode material containing a metal, to opposite side surfaces of the element body and edge surfaces of the element body adjacent to the side surfaces. The method also includes sintering the mixed material and forming a base layer, in which the metal and the co-material are mixedly present, on the opposite side surfaces of the element body and the edge surfaces of the element body. The method also includes oxidizing the metal of the base layer, and forming an oxide film of the metal on surfaces of the base layer. The method also includes removing the oxide film from at least one of the surfaces of the base layer, while leaving the oxide film on at least a portion of the edge surfaces of the element body. The method also includes forming a plating layer on those surfaces of the base layer from which the oxide film has been removed.

The step of removing the oxide film from at least one of the surfaces of the base layer may include blasting the oxide film from at least one of the surfaces of the base layer to polish the surface(s) of the base layer.

The step of forming the element body may include forming a sheet that contains, as its main component, dielectric ceramic, and applying a conductive paste, which contains the metal of the base layer, on the sheet. The element body may be sintered during the step of sintering the mixed material.

According to one aspect of the present invention, the oxide layer formed on each external electrode hardly peels from the external electrode.

It is to be understood that both the foregoing general description and the following detailed description are exemplary and explanatory, and are intended to provide further explanation of the invention as claimed.

DETAILED DESCRIPTION OF THE EMBODIMENTS

Figure 1:
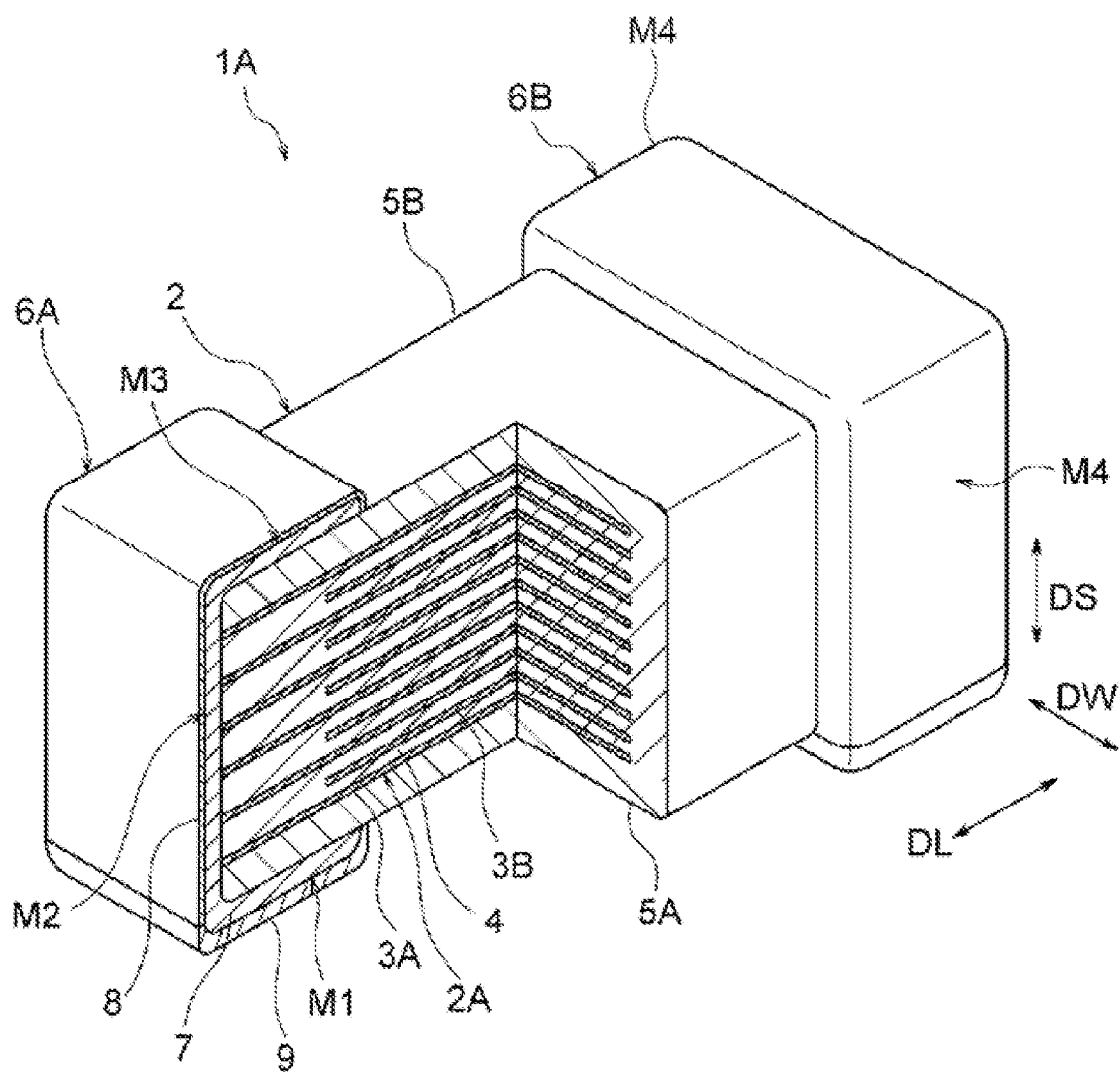
FIG. 1 is a perspective view showing a configuration of a multilayer ceramic capacitor according to a first embodiment of the present invention.

Embodiments of the present invention will now be described with reference to the accompanying drawings. The following embodiments are not intended to limit the present invention. The combination of all the features described in each of the embodiments is not always essential to the present invention. The configuration of each embodiment may be modified and/or changed depending upon designs, specifications and various conditions of an apparatus and a device to which the present invention is applied (use conditions, use environment, and the like). The technical scope of the invention is defined by the appended claims and is not limited by the following embodiments. Further, parts, components and elements shown in the drawings used in connection with the following description may be different from actual parts, components and elements in structure, scale and shape for the sake of easier understanding of the parts, components and elements.

First Embodiment

Figure 2:
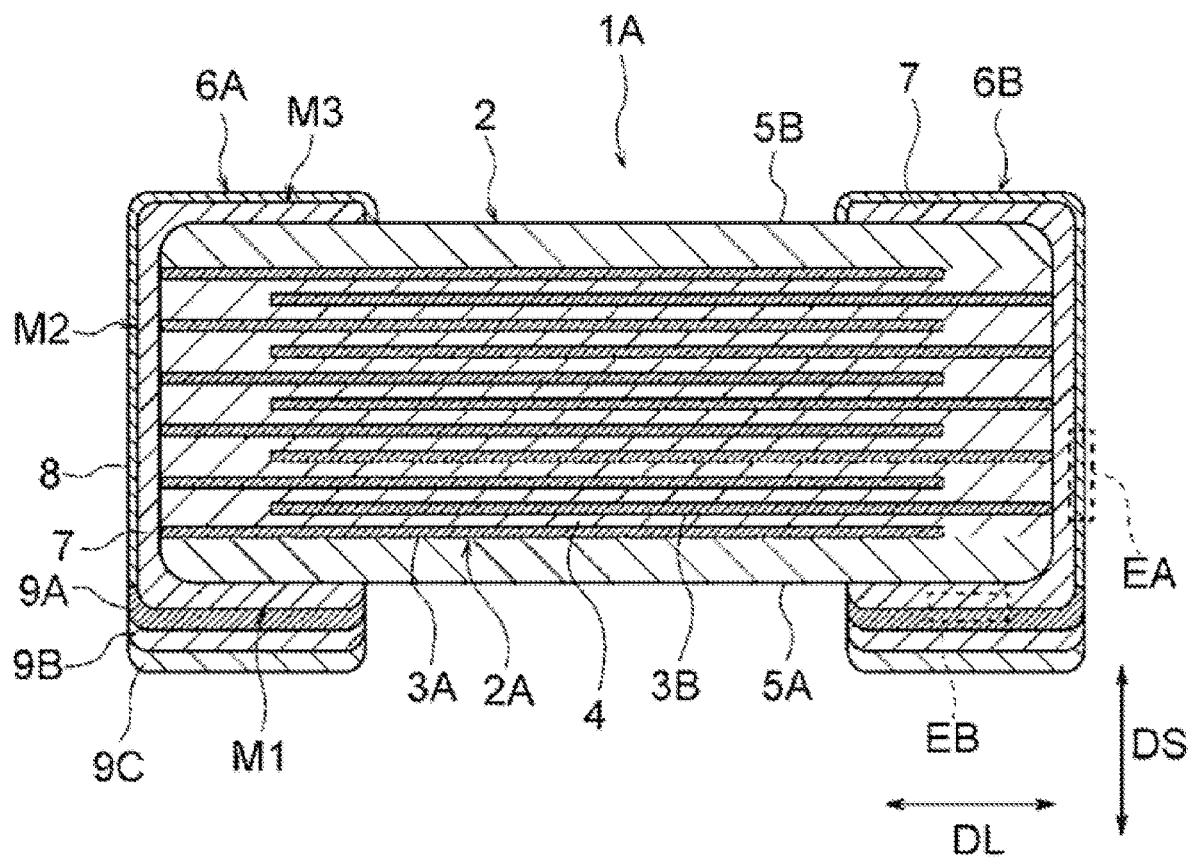
FIG. 2 is a cross-sectional view obtained by cutting the multilayer ceramic capacitor of FIG. 1 lengthwise.

FIG. 1 is a perspective view showing a configuration of a multilayer ceramic capacitor 1A according to a first embodiment of the present invention. FIG. 2 is a cross-sectional view of the multilayer ceramic capacitor 1A of FIG. 1, taken in a longitudinal direction of the multilayer ceramic capacitor 1A of FIG. 1.

In FIG. 1 and FIG. 2, the multilayer ceramic capacitor 1A includes an element body (element assembly) 2, an external electrode (outer electrode) 6A and another external electrode (outer electrode) 6B. The element body 2 has a laminate (or a stack) 2A, a lower cover layer 5A and an upper cover layer 5B. The laminate 2A has inner electrode layers 3A, another inner electrode layers 3B and dielectric layers 4.

The lowermost layer of the laminate 2A is covered with the lower cover layer 5A, and the uppermost layer of the laminate 2A is covered with the upper cover layer 5B. The inner electrode layers 3A and 3B are alternately laminated via the dielectric layers 4. The shape of the element body 2 may be a substantially rectangular parallelepiped shape, and the shape of the laminate 2A may also be a substantially rectangular parallelepiped shape. The element body 2 may be chamfered along the respective ridges (edges) of the element body 2. In the following description, the direction in which the two side surfaces of the element body 2 face each other may be referred to as a longitudinal direction DL, the direction in which the front and rear surfaces of the element body 2 face each other may be referred to as a width direction DW, and the direction in which the top and bottom surfaces of the element body 2 face each other may be referred to as a stacking direction DS.

The external electrodes 6A and 6B are located on opposite sides of the element body 2, respectively. The external electrodes 6A and 6B are spaced (separated) from each other. Each of the external electrodes 6A and 6B continuously extends from the side surface of the element body 2 to the front and rear surfaces and the top and bottom surfaces.

In the longitudinal direction DL, the inner electrode layers 3A and 3B are arranged at alternately different positions in the laminate 2A. The inner electrode layers 3A can be disposed more towards one side surface of the element body 2 relative to the inner electrode layers 3B, and the inner electrode layers 3B can be disposed more towards the opposite side surface of the element body 2 relative to the inner electrode layers 3A. The ends of the inner electrode layers 3A are drawn to left ends of the respective dielectric layers 4 at one side surface (left side surface) in the longitudinal direction DL of the element body 2 and connected to the outer electrode 6A. The ends of the inner electrode layers 3B are drawn to the right ends of the dielectric layers 4 at the other side surface in the longitudinal direction DL of the element body 2 and connected to the outer electrode 6B.

On the other hand, in the direction (width direction DW) which is perpendicular to the direction in which the side surfaces of the element body 2 face each other (length direction DL), the ends of the inner electrode layers 3A and 3B are covered with the dielectric layers 4. In the width direction DW, the positions of the ends of the inner electrode layers 3A may be aligned with the positions of the ends of the inner electrode layers 3B.

The outer size of the multilayer ceramic capacitor 1A has, for example, the following values. The length is 1.0 mm, the width is 0.5 mm, and the height is 0.5 mm. The thickness of each of the inner electrode layers 3A, the inner electrode layers 3B and the dielectric layers 4 in the stacking direction DS may be in the range from 0.05 µm to 5 µm, respectively, for example, 0.3 µm.

The material of the inner electrode layer 3A, 3B can be selected from metals such as, for example, Cu (copper), Ni (nickel), Ti (titanium), Ag (silver), Au (gold), Pt (platinum), Pd (palladium), Ta (tantalum) and W (tungsten), and may be an alloy containing these metals.

The main component of the material of the dielectric layers 4 is, for example, a ceramic material having a perovskite structure. The main component may be contained in a ratio of 50 at % or more. The ceramic material of the dielectric layers 4 may be selected from, for example, barium titanate, strontium titanate, calcium titanate, magnesium titanate, barium strontium titanate, barium calcium titanate, calcium zirconate, barium zirconate, calcium titanate zirconate and titanium oxide.

The main component of the material of the lower cover layer 5A and the upper cover layer 5B may be, for example, a ceramic material. The main component of the ceramic material of the lower cover layer 5A and the upper cover layer 5B may be the same as the main component of the ceramic material of the dielectric layers 4.

As shown in FIG. 1 and FIG. 2, the external electrodes 6A and 6B are spaced from each other in the length direction DL and are formed on a plurality of surfaces on the element body 2. Each of the external electrodes 6A and 6B has a mounting surface M1 and an upper surface M3 facing each other in the stacking direction DS, a side surface M2, a front surface M4 and a rear surface M4 facing each other in the width direction DW. Each of the external electrodes 6A and 6B includes a base layer (underlayer) 7 and a plating layer 9 on the mounting surface M1. The side surface M2 of the external electrode 6A faces the side surface M2 of the external electrode 6B in the length direction DL. The mounting surface M1 is a surface that faces the circuit board on which the multilayer ceramic capacitor 1A is mounted. The mounting surface M1 is provided on the lower surface of the element body 2. The thickness of each of the external electrodes 6A and 6B on the mounting surface M1 in the stacking direction DS is, for example, in the range from 10 µm to 40 µm.

The oxide layer 8 is formed on the base layer 7 on those surfaces other than the mounting surface M1 of each of the external electrodes 6A and 6B (i.e., the side surface M2, the upper surface M3, the front surface M4 and the rear surface M4)-. The base layer 7 is continuously formed on the element body 2 such that the base layer 7 is present on the side surface M2 and extends over the mounting surface M1 from the side surface M2. The base layer 7 also extends over the upper surface M3, the front surface M4 and the rear surface M4 from the side surface M2.

The base layer 7 includes a metal as a conductive material. For example, the metal of the base layer 7 contains at least one of Cu, Fe (iron), Zn (zinc), Al (aluminum), Ni, Pt, Pd, Ag, Au and Sn (tin) or an alloy thereof as a main component thereof. The base layer 7 further includes particles of the co-material. The co-material reduces the difference in thermal expansion coefficient between the element body 2 and the base layer 7, and alleviates the stress applied to the base layer 7. The co-material is, for example, a ceramic component which is a main component of the dielectric layers 4. The base layer 7 may contain a glass component. The glass component is used for densification or the like of the base layer 7. The glass component is, for example, an oxide of Ba (barium), Sr (strontium), Ca (calcium), Zn, Al, Si (silicon) or B (boron). The base layer 7 is electrically connected to a plurality of internal electrode layers drawn to the side surface of the element body.

The material of the oxide layer 8 includes an oxide film of a metal used as a conductive material of the base layer 7, and a material used for the co-material of the base layer 7. The co-material of the base layer 7 can have the same composition as the dielectric layers 4, for example, barium titanate. The metal used as the conductive material of the base layer 7 is, for example, nickel. The oxide film of the metal used as the conductive material of the base layer 7 is, for example, nickel oxide, and its thickness is, for example, in the range from 0.05 µm to 3 µm.

Each of the base layer 7 and the oxide layer 8 may have a metal component contained in the element body 2. The metal component contained in the element body 2 may include at least one of Mg, Ni, Cr, Sr, Al, Na and Fe. For example, the metal component contained in the element body 2 is Mg. If the metal component is Mg, each of the base layer 7 and the oxide layer 8 may include a compound of the metal used as the conductive material of the base layer 7, the metal contained in the element body 2 and oxygen. For example, the compound included in each of the base layer 7 and the oxide layer 8 contains Ni, Mg, and O.

The main component of the material of the plating layer 9 is, for example, a metal such as Cu, Ni, Al, Zn and Sn or an alloy containing at least two of Cu, Ni, Al, Zn and Sn. The plating layer 9 may be a plating layer of a single metal component or may include a plurality of plating layers of different metal components. For example, as shown in FIG. 2, the plating layer 9 may have a three-layer structure, i.e., the plating layer 9 may include a Cu plating layer 9A formed on the base layer 7, an Ni plating layer 9B formed on the Cu plating layer 9A, and an Sn plating layer 9C formed on the Ni plating layer 9B. The Cu plating layer 9A can improve the adhesion of the plating layer 9 to the base layer 7. The Ni plating layer 9B can improve the heat resistance of the external electrode 6A, 6B during soldering. The Sn plating layer 9C can improve the wettability of the solder of the plating layer 9. The plating layer 9 is formed on a portion of the base layer 7 such that the plating layer 9 electrically conducts to the inner electrode layer. For example, the plating layer 9 may be formed on one surface of the base layer 7 which extends in a direction perpendicular to the stacking direction DS. Further, the plating layer 9 electrically conducts to the terminals of the circuit board through the solder. Incidentally, when the metal component of the base layer 7 is Cu, the Cu plating layer 9A may not be formed. If the Cu plating layer 9A is not formed, the plating layer 9 may have a two-layer structure, i.e., the plating layer 9 may include the Ni plating layer 9B and the Sn plating layer 9C formed on the Ni plating layer 9B.

Figure 3A:
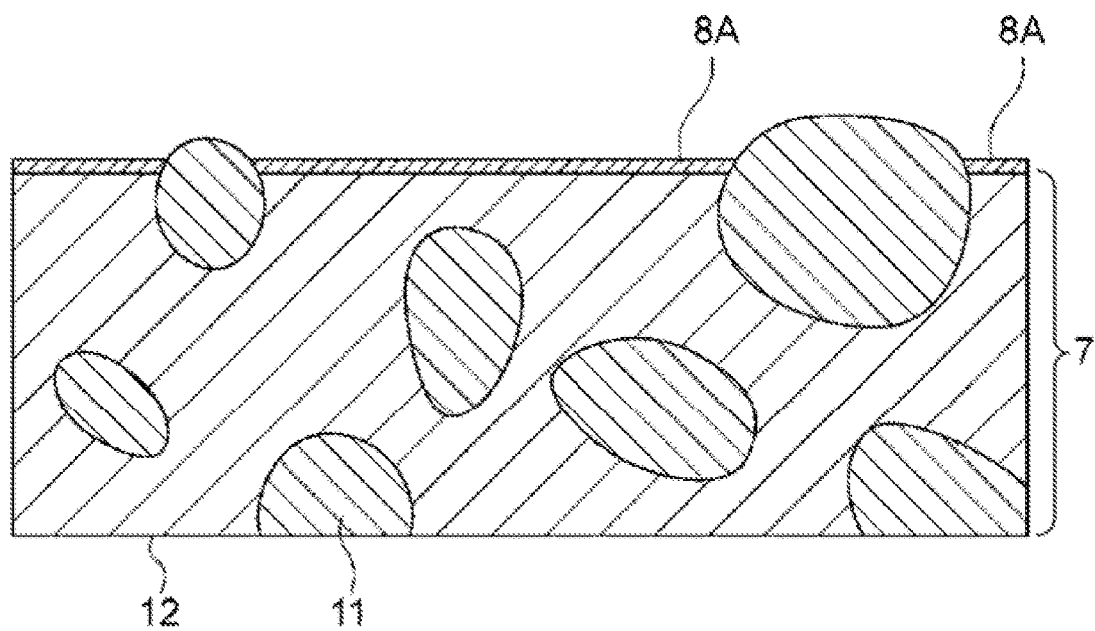
FIG. 3A is an enlarged cross-sectional view of an EA portion of the external electrode in FIG. 2.
Figure 3B:
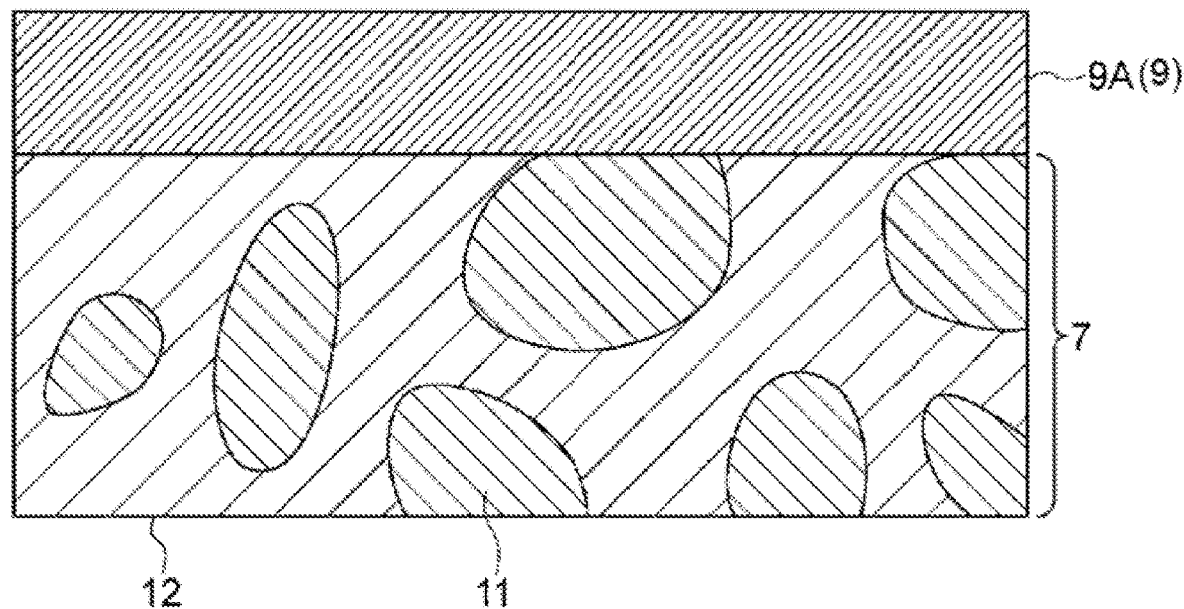
FIG. 3B is an enlarged cross-sectional view of an EB portion of the external electrode in FIG. 2.

FIG. 3A is a cross-sectional view showing an enlarged configuration of the EA portion of the external electrode 6B shown in FIG. 2, and FIG. 3B is a cross-sectional view showing an enlarged configuration of the EB portion of the external electrode 6B shown in FIG. 2. The external electrode 6A has the same configuration as the external electrode 6B.

As depicted in FIG. 3A and FIG. 3B, the conductor 12 and the co-material 11 are present in the base layer 7 in a mixed manner The main component of the conductor 12 is a metal that includes at least one of Cu, Fe, Zn, Al, Ni, Pt, Pd, Ag, Au and Sn, or an alloy thereof. The co-material 11 is, for example, an oxide ceramic which is a main component of the dielectric layers 4.

As shown in FIG. 3A, the surface of the conductor 12 of the base layer 7 on the side surface M2, the upper surface M3, the front surface M4 and the rear surface M4 of each of the external electrodes 6A and 6B is coated with an oxide film 8A. The oxide film 8A is an oxide film of a metal or an alloy used in the conductor 12. The oxide film 8A is divided/punctured by the co-material particles 11 that exist at the surface of the base layer 7. The oxide layer 8 can be configured to include the oxide film 8A together with the surface layer defined by the co-material particles 11.

On the other hand, FIG. 3B illustrates the structure at the mounting surface M1, which is made by a manufacturing method that will be described later. As shown in FIG. 3B, on the mounting surface M1 of the external electrode 6A, 6B, the oxide film 8A is not formed on the surface of the conductor 12 exposed from the base layer 7. Instead, the plating layer 9 is formed on the base layer 7. Thus, the conductor 12 and the plating layer 9 are connected to each other and the conductivity of the mounting surface M1 of the external electrode 6A, 6B is ensured.

In FIG. 3A, the oxide film 8A of nickel oxide is formed on the conductor 12. The co-material particles 11 and the conductor 12 are mixed in a mosaic-like pattern in the depth direction of the base layer 7. The co-material particles 11 are distributed in the form of irregular-shaped islands in the conductor 12. The co-materials 11 are continuously present from the oxide layer 8 to the base layer 7 (i.e., as shown in FIG. 3A, some of the co-material particles 11 reach the oxide layer 8 from the base layer 7, having a continuous structure from the oxide layer 8 to the base layer 7 to a certain depth), and may have a single or poly crystal structure or amorphous structure therein. Similarly, the conductor 12 continuously exists from below the oxide layer 8 to the base layer 7, and may have a single or poly-crystal structure or amorphous structure.

Figure 4:
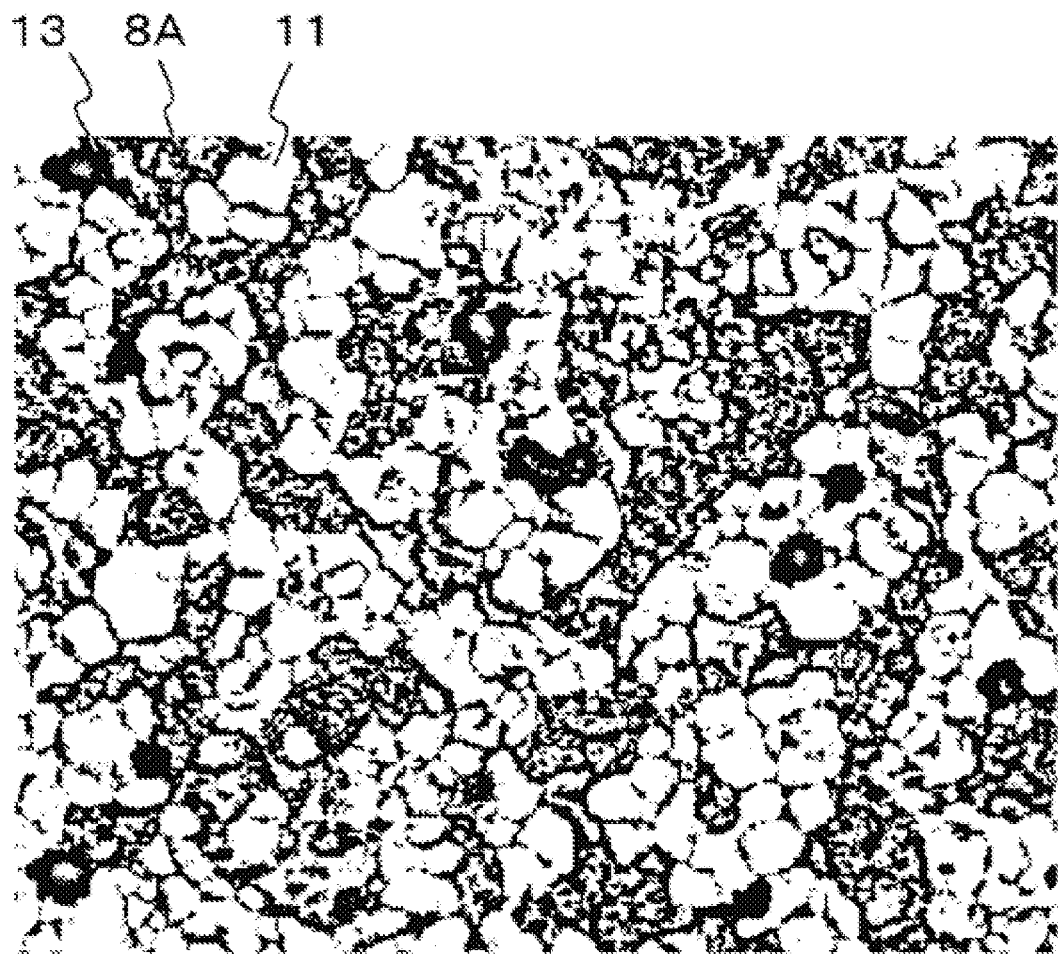
FIG. 4 is a schematic view showing an exemplary composition of the surface of the oxide layer of the external electrode shown in FIG. 2.

FIG. 4 schematically illustrates an exemplary composition of the surface of the oxide layer 8 of FIG. 2. FIG. 4 shows the example in which the metal used for the conductor 12 of the base layer 7 is Ni, the oxide ceramics used for the co-material 11 is barium titanate ($BaTiO_3$), and the oxide film 8A is a nickel oxide.

In FIG. 4, the co-material 11 and the oxide film 8A are mixedly present on the surface of the oxide layer 8. The co-material 11 and the oxide film 8A are mixedly present in the form of crystalline or amorphous particles such that the particles of the co-material 11 are dispersed in the particles of the oxide film 8A. The co-material particles 11 are distributed in the form of islands over the entire surface of the oxide layer 8. The size (length) of one particle of the particulate co-material 11 in the major axis is in the range from 0.1 μm to 8 μm. The compounds 13 of Mg, Ni and O are segregated in form of particulates on the surface of the oxide layer 8. When the oxide layer 8 is viewed from the surface as in FIG. 4, the ratio of the co-material to the entire composition is in the range from 20 at % to 75 at %. This can be confirmed by, for example, surface analysis of a sufficiently large area by EDX (Energy dispersive X-ray spectroscopy). The sufficiently large area here should be sufficiently large to represent the surface composition of the oxide layer 8.

The co-material 11 extends toward the element body 2 via the base layer 7 from the surface of the oxide layer 8. The co-material 11 is made by a plurality of particles collected to a size of about 1 μm to 40 μm, and can be distributed in the depth direction. Therefore, even when a mechanical stress is applied to the oxide layer 8, peeling of the co-material 11 exposed on the surface of the oxide layer 8 hardly occurs. When the mechanical stress is applied to the oxide layer 8, the co-material 11 can serve as a strut penetrating the oxide layer 8, and support the oxide layer 8 on the base layer 7.

The co-material 11 is exposed on the surface of the oxide layer 8, and punctures the oxide film 8A made of nickel oxide. Therefore, even when the mechanical stress is applied to the oxide layer 8 and the oxide film 8A made of nickel oxide peels off the conductor 12, the progress of peeling of the oxide film 8A is prevented at the position of the co-material 11 exposed on the surface of the oxide layer 8.

Consequently, even when the mechanical stress is applied to the oxide layer 8, it is possible to reduce the possibility of immediate breakage of the entire oxide layer 8, and reduce the possibility of peeling of the oxide film 8A (oxide layer 8) from the external electrode 6A, 6B.

Since the oxide layer 8 includes the particulate compound 13 of Mg, Ni and O, it is possible to improve the adhesion strength between the oxide layer 8 and the base layer 7. Thus, it is possible to further reduce the possibility of peeling of the oxide layer 8 from the external electrode 6A, 6B.

According to the above-described first embodiment, the oxide layer 8 includes the oxide film of the metal used as the conductive material of the base layer 7, and the co-material of the base layer 7. Thus, it is possible to suppress the peeling of the oxide layer 8 from each of the external electrodes 6A and 6B. Since the multilayer ceramic capacitor 1A has the oxide layer 8, which hardly peels off, the side surface M2, the upper surface M3, the front surface M4 and the rear surface M4 of each of the external electrode 6A and 6B, the wet solder does not get wet or move upward onto these surfaces of the external electrodes 6A, 6B except on the mounting surface M1, and the mounting of the capacitor 1A (electronic component) by soldering can be carried out in a stable manner.

Second Embodiment

Figure 5:
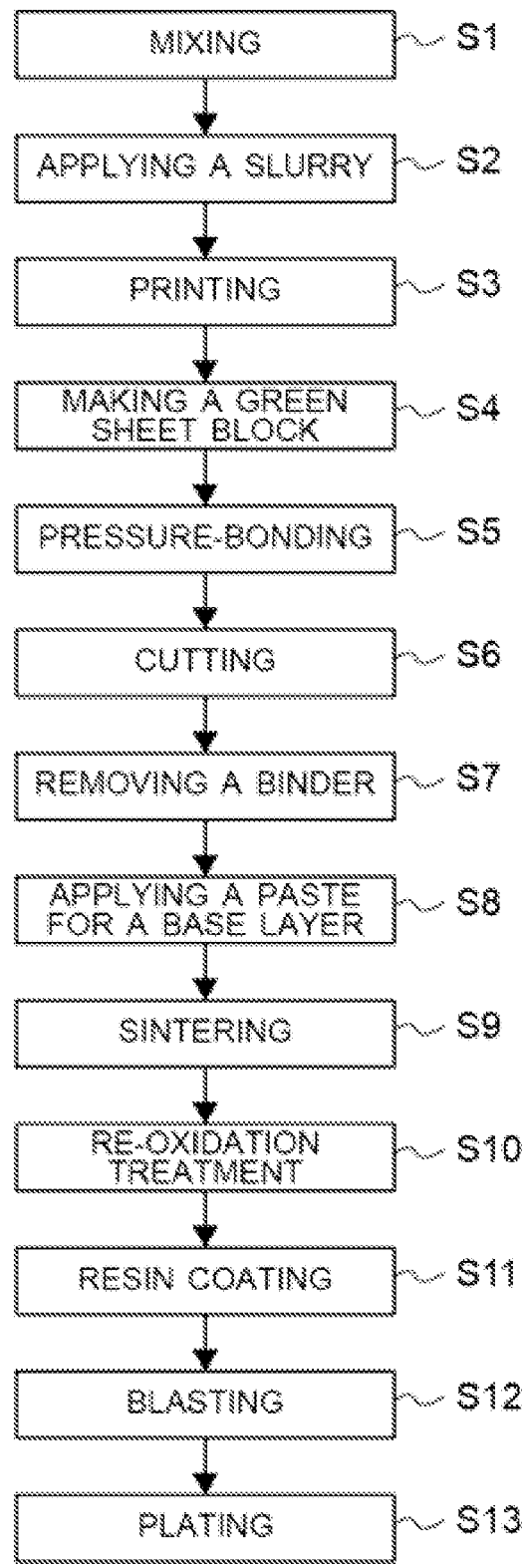
FIG. 5 is a flowchart showing a method of manufacturing a multilayer ceramic capacitor according to a second embodiment of the present invention.

FIG. 5 is a flowchart showing a method of manufacturing a multilayer ceramic capacitor. The method of manufacturing the multilayer ceramic capacitor will be described as a second embodiment of the present invention. FIG. 6A to FIG. 6H, FIG. 6J and FIG. 6k is a series of cross-sectional views showing an exemplary method of manufacturing the multilayer ceramic capacitor according to the second embodiment. Incidentally, for the sake of illustration, FIG. 6C to FIG. 6K show only the two inner electrode layers 3A and the two inner electrode layers 3B laminated alternately through the dielectric layers 4.

In Step S1 of FIG. 5, an organic binder and an organic solvent as a dispersant and a forming aid are added to a dielectric material powder, and pulverized and mixed to produce a muddy slurry. The dielectric material powder includes, for example, a ceramic powder. The dielectric material powder may include an additive or additives. The additive(s) may be, for example, Mg, Mn, V, Cr, Y, Sm, Eu, Gd, Tb, Dy, Ho, Er, Tm, Yb, Co, Ni, Li, B, Na, K or Si oxide or glass. The organic binder is, for example, a polyvinyl butyral resin or a polyvinyl acetal resin. The organic solvent is, for example, ethanol or toluene.

Figure 6A:
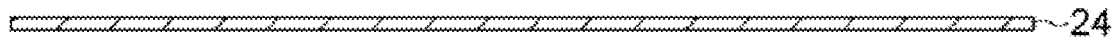
FIG. 6A is a cross-sectional view useful to describe the method of manufacturing the multilayer ceramic capacitor according to the second embodiment.

Next, as indicated in Step S2 of FIG. 5 and shown in FIG. 6A, a green sheet 24 is manufactured. Specifically, the slurry containing the ceramic powder is applied onto a carrier film in a sheet form and dried to manufacture the green sheet 24. The carrier film is, for example, a PET (polyethylene terephthalate) film. The application of the slurry is carried out by, for example, a doctor blade method, a die coater method or a gravure coater method. Step S2 is repeated to prepare a plurality of green sheets 24.

Figure 6B:
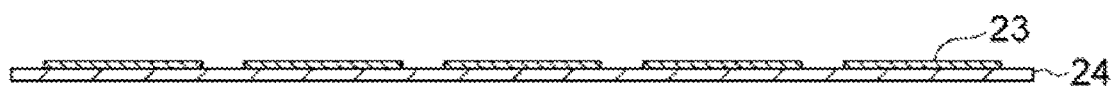
FIG. 6B is another cross-sectional view useful to describe the method of manufacturing the multilayer ceramic capacitor according to the second embodiment.

Next, as indicated in Step S3 of FIG. 5 and shown in FIG. 6B, a conductive paste, which will become the inner electrode, is applied in a predetermined pattern onto each of those green sheets 24, which will form the inner electrode layers 3A and 3B shown in FIG. 1, among the green sheets prepared in Step S1 to form a plurality of inner electrode patterns 23 on that green sheet 24. In Step S3, it is possible to form a plurality of inner electrode patterns 23 on the single green sheet 24 such that the inner electrode patterns 23 are separated from each other in the longitudinal direction of the green sheet 24. The conductive paste for the inner electrode includes a powder of the metal used as the material of the inner electrode layer 3A, 3B. For example, if the metal used as the material of the inner electrode layer 3A, 3B is Ni, the conductive paste for the inner electrode includes a powder of Ni. Further, the conductive paste for the inner electrode includes a binder, a solvent, and, if necessary, an auxiliary agent. The conductive paste for the inner electrode may include, as a co-material, a ceramic material which is the main component of the dielectric layers 4. The application of the conductive paste for the inner electrode may be carried out by a screen printing method, an ink jet printing method or a gravure printing method. Thus, Step S3 may be referred to as a printing step. In this manner, a plurality of green sheets 24 that have the inner electrode patterns 23 thereon are prepared.

Figure 6C:
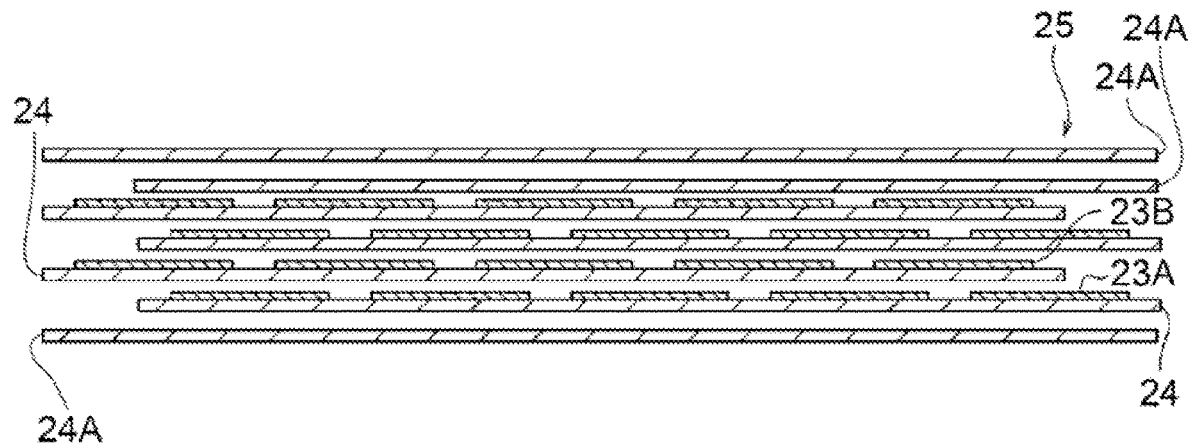
FIG. 6C is still another cross-sectional view useful to describe the method of manufacturing the multilayer ceramic capacitor according to the second embodiment.

Next, as indicated in Step S4 of FIG. 5 and shown in FIG. 6C, the green sheets 24 on which the inner electrode patterns 23 are formed and the green sheets 24A on which the inner electrode patterns 23 are not formed are laminated in a predetermined order to create a block 25 of the green sheets 24. The green sheets 24A on which the inner electrode patterns 23 are not formed are used as outer layers. In Step S4, the green sheets 24 having the inner electrode patterns 23 thereon are divided into two groups, i.e., the green sheets 24 having the inner electrode patterns 23A thereon and the green sheets 24 having the inner electrode patterns 23B thereon. Then, the green sheets 24 having the inner electrode patterns 23A thereon and the green sheets 24 having the inner electrode patterns 23B thereon are stacked alternately in the laminating direction such that the inner electrode patterns 23A on the green sheet 24 and the inner electrode patterns 23B on the next or adjacent green sheet 24 are alternately shifted in the longitudinal direction of the green sheet 24. Further, three type of portions are defined in the green sheet block 25. Specifically, a portion where only the inner electrode patterns 23A are stacked in the stacking direction, a portion where the inner electrode patterns 23A and 23B are stacked alternately in the stacking direction, and a portion where only the inner electrode patterns 23B are stacked in the stacking direction are defined the green sheet block 25.

Figure 6D:
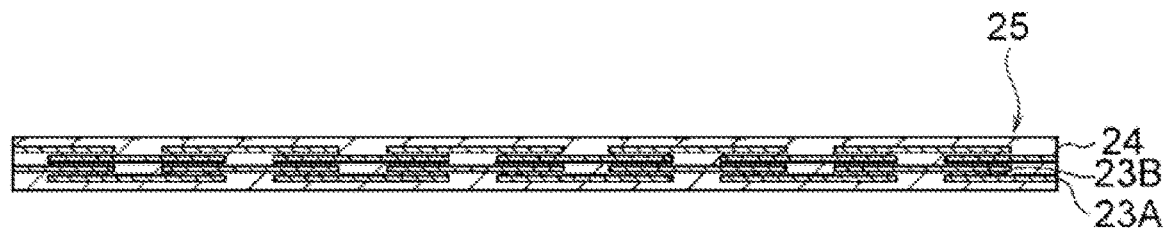
FIG. 6D is yet another cross-sectional view useful to describe the method of manufacturing the multilayer ceramic capacitor according to the second embodiment.

Next, as indicated in Step S5 of FIG. 5 and shown in FIG. 6D, the laminate block 25 obtained in the forming process of Step S4 of FIG. 5 is pressed such that the green sheets 24 are pressure-bonded. Pressing the laminate block 25 may be carried out by, for example, sandwiching the laminate block 25 between resin films, and hydrostatically pressing the laminate block 25.

Figure 6E:
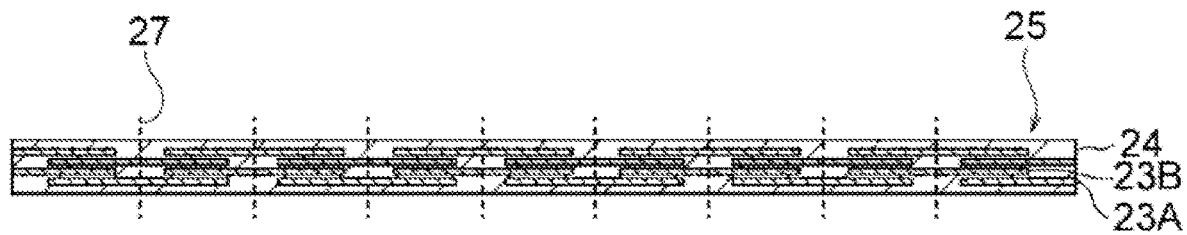
FIG. 6E is another cross-sectional view useful to describe the method of manufacturing the multilayer ceramic capacitor according to the second embodiment.

Then, as indicated in Step S6 of FIG. 5 and shown in FIG. 6E, the pressed laminate block 25 is cut such that the block 25 is separated to a plurality of element bodies, each of which has a rectangular parallelepiped shape. Each element body has six surfaces. The cutting of the laminate block 25 is carried out at the portions where only the inner electrode patterns 23A are present in the stacking direction, and the portions where only the inner electrode patterns 23B are present in the stacking direction, as indicated by a plurality of vertical broken lines 27. The cutting of the laminate block 25 is carried out by, for example, blade dicing or a similar method. The resulting element bodies 2 are shown in FIG. 6F.

Figure 6F:
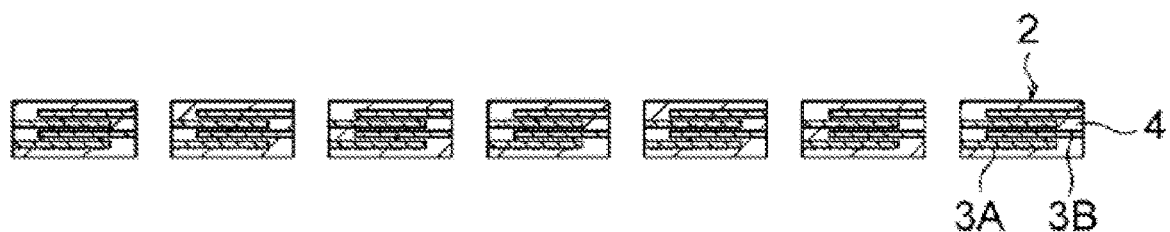
FIG. 6F is another cross-sectional view useful to describe the method of manufacturing the multilayer ceramic capacitor according to the second embodiment.

As illustrated in FIG. 6F, the inner electrode layers 3A and 3B are alternately laminated via the dielectric layers 4 in each of the individual element bodies 2. The inner electrode layers 3A are exposed on one side face of each element body 2, and the inner electrode layers 3B are exposed on the other side face of each element body 2.

Next, as indicated in Step S7 of FIG. 5, the binder contained in each of the element bodies 2 obtained in Step S6 of FIG. 5 is removed. The removal of the binder is carried out by, for example, heating the element bodies 2 in an N2 atmosphere at about 350 degrees C.

Next, as indicated in Step S8 of FIG. 5, a conductive paste for the base layer (underlayer) 7 is applied to both side surfaces of each element body 2 from which the binder is removed in Step S7 of FIG. 5 and to those edges of the remaining four surfaces of the element body 2 which are in contact with the respective side surfaces. Then, the conductive paste is dried. The conductive paste for the base layer 7 includes a powder or filler of the metal used as the conductive material of the base layer 7. For example, when the metal used as the conductive material of the base layer 7 is Ni, the conductive paste for the base layer includes a powder or filler of Ni. Further, the conductive paste for the base layer includes, as a co-material, a ceramic component, which is the main component of the dielectric layers 4, for example. Particles of oxide ceramics mainly composed of barium titanate (0.8 μm to 4 μm in D50 particle diameter), for example, are mixed in the conductive paste for the base layer, as the co-material, in the range from 10 wt % to 40 wt %. Further, the conductive paste for the base layer includes a binder and a solvent.

Figure 6G:
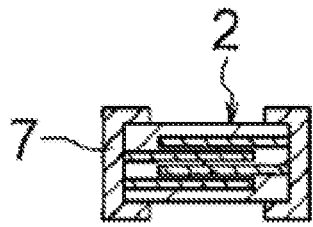
FIG. 6G is another cross-sectional view useful to describe the method of manufacturing the multilayer ceramic capacitor according to the second embodiment.

Next, as indicated in Step S9 of FIG. 5 and shown in FIG. 6G, the element bodies 2, on which the conductive paste for the base layer is applied in Step S8 of FIG. 5, undergo the sintering process such that the inner electrode layers 3A and 3B are integrated with the dielectric layers 4 in each element body 2 and the base layers 7 are formed and integrated with the element body 2. The sintering of the element bodies 2 is carried out in, for example, a firing furnace in a temperature range from 1000 degrees C. to 1350 degrees C. for ten minutes to two hours. If a base metal such as Ni or Cu is used as the material of the inner electrode layer 3A, 3B, the sintering process may be carried out in the firing furnace while the interior of the firing furnace is kept to a reducing atmosphere in order to prevent the oxidation of the inner electrode layers 3A and 3B.

Figure 6H:
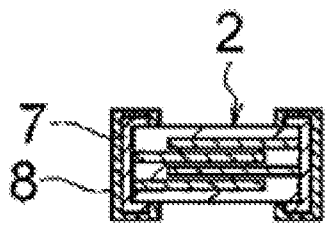
FIG. 6H is another cross-sectional view useful to describe the method of manufacturing the multilayer ceramic capacitor according to the second embodiment.

Next, as indicated in Step S10 of FIG. 5 and shown in FIG. 6H, the metal exposed on the surface of each base layer 7 is oxidized to form an oxide layer 8, which includes an oxide film of that metal and the co-material of the base layer 7, on the surface of the base layer 7. In the oxidation of the metal exposed on the surface of each base layer 7, it is possible to repeatedly perform the oxidation treatment at 600 degree C. to 1000 degrees C. in an N2 gas atmosphere, for example. Incidentally, in order to ensure that the oxide film of the metal exposed on the surface of each base layer 7 is formed to a sufficient thickness, oxygen may be added to the atmosphere gas of the reoxidation process.

Next, as indicated in Step S11 of FIG. 5, four surfaces (i.e., the side surface M2, the upper surface M3, the front surface M4, and the rear surface M4) other than the mounting surface M1 of each of the base layers 7 are coated with a resist resin. The coating of the resist resin is carried out by, for example, applying the resist resin by a transfer roller and thermally curing the resist resin.

Figure 6J:
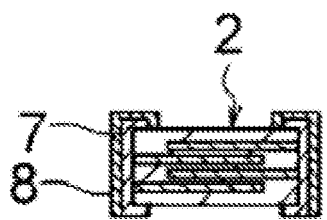
FIG. 6J is another cross-sectional view useful to describe the method of manufacturing the multilayer ceramic capacitor according to the second embodiment.

Next, as indicated in Step S12 of FIG. 5 and shown in FIG. 6J, the oxide film is removed from the mounting surface M1 of each base layer 7 by blasting (blast-polishing) to expose the metal contained in the mounting surface M1 of the base layer 7. In the blasting process, the element body 2 is placed in a blasting device such that the mounting surfaces M1 are directed upward, and then the blast media are applied to the mounting surfaces M1 from directly above the element body 2. The blast media applied from directly above the element body 2 wraps around the side surfaces of the element body 2, but the side surface M2, the upper surface M3, the front surface M4 and the rear surface M4 of each of the two base layers 7 are covered with the resist resin. Thus, the oxide film can remain on the side surface M2, the upper surface M3, and the front surface M4 and the rear surface M4 of each base layer 7. After blasting, the resist resin is removed by a solvent or the like.

Figure 6K:
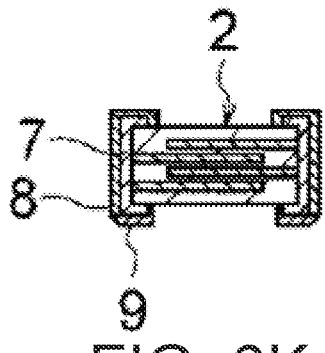
FIG. 6K is another cross-sectional view useful to describe the method of manufacturing the multilayer ceramic capacitor according to the second embodiment.

Next, as indicated in Step S13 of FIG. 5 and shown in FIG. 6K, a plating layer 9 is formed on the mounting surface M1 of each of the base layers 7. In the process of forming the plating layer 9, for example, Cu plating, Ni plating and Sn plating may be sequentially performed. In this process, the element body 2 whose oxide film on the mounting surface M1 of each of the base layers 7 is removed is placed in a barrel together with the plating solution, and the electricity is supplied to the barrel while rotating the barrel, so as to form the plating layer 9. During this process, the oxide film is present on the side surface M2, the upper surface M3, the front surface M4 and the rear surface M4 of each base layer 7, and therefore the plating layer is not formed on these surfaces.

Figure 7A:
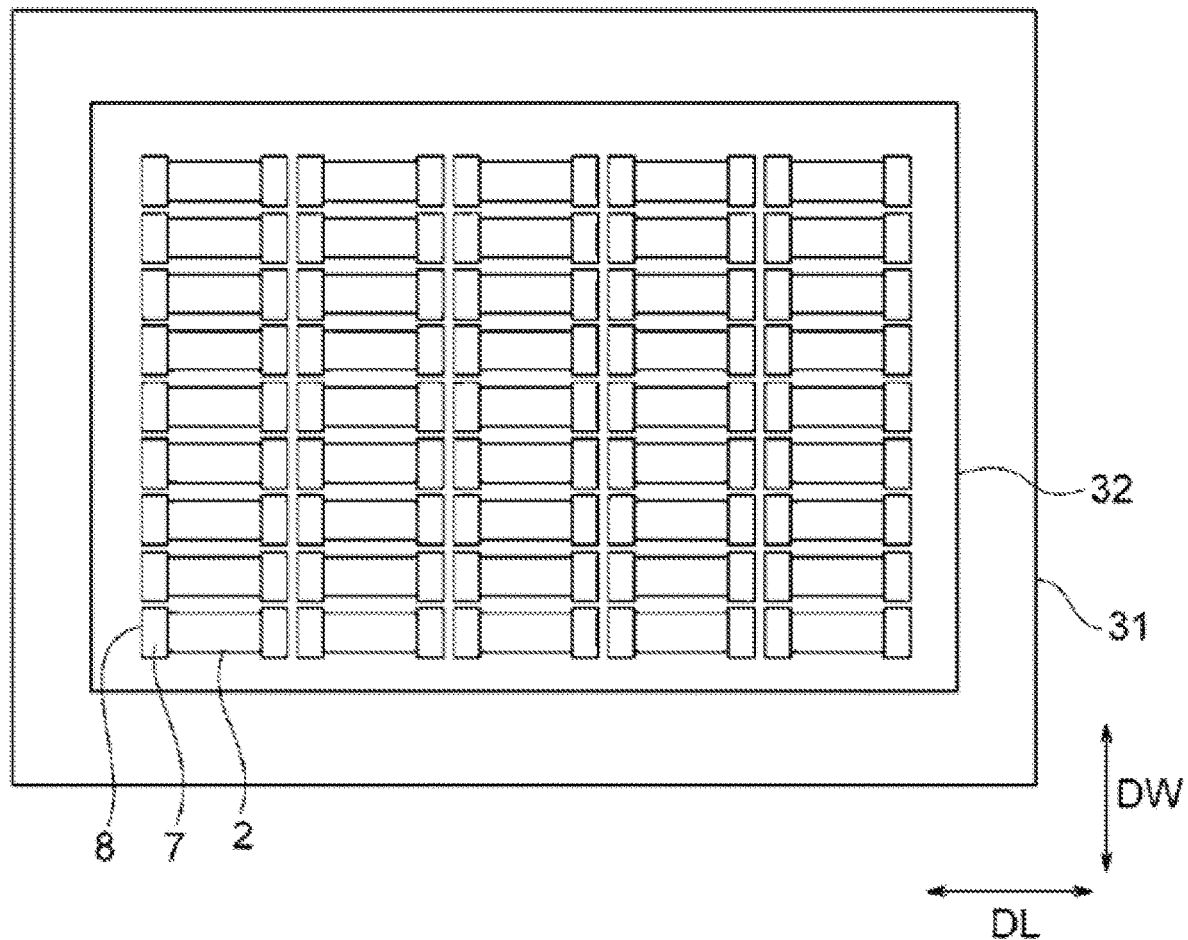
FIG. 7A is a plan view showing an exemplary process of FIG. 6J.
Figure 7B:
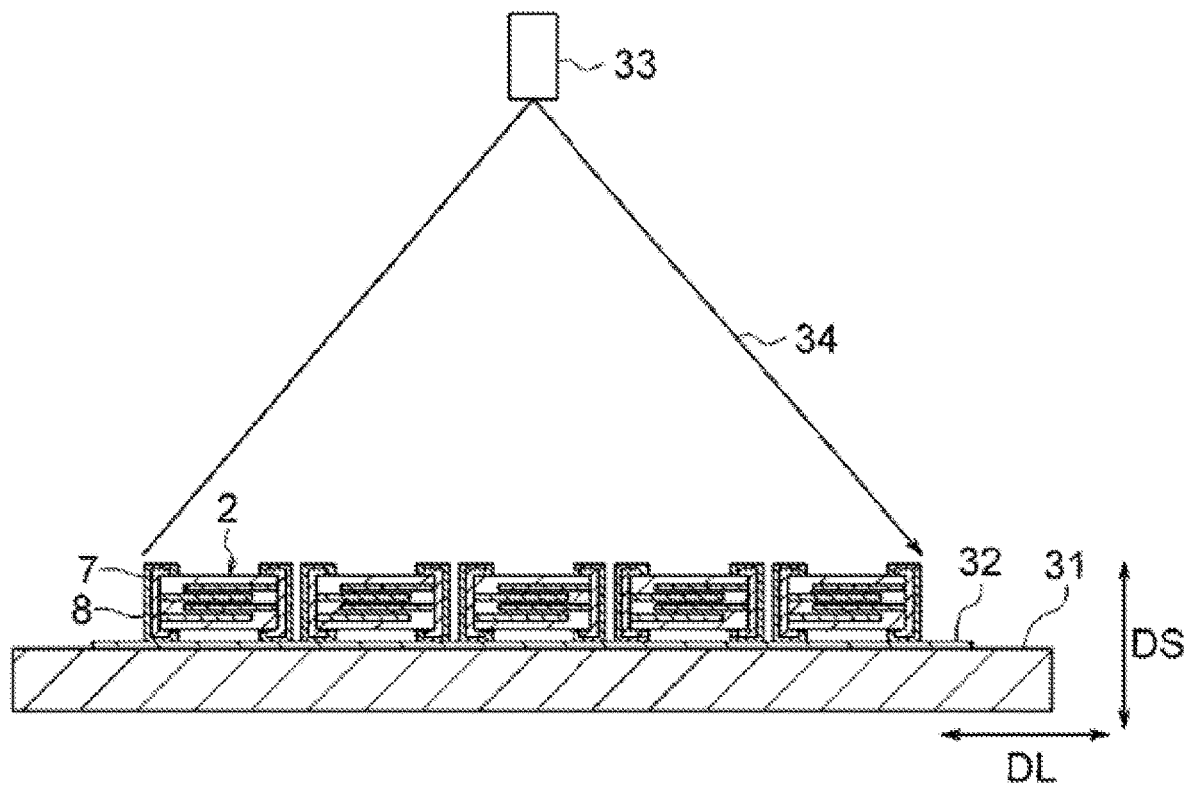
FIG. 7B is a cross-sectional view obtained by cutting the structure of FIG. 7A lengthwise.

FIG. 7A is a plan view showing an exemplary process of FIG. 6J, and FIG. 7B is a cross-sectional view obtained by cutting FIG. 7A in the length direction DL.

In FIG. 7A and FIG. 7B, a plurality of element bodies 2 each of which includes the oxide film 8 formed on the surface of each base layer 7 are placed on a substrate 31. When placing the element bodies 2 on the substrate 31, the upper surface M3 of each element body 2 is attached on the substrate 31 through a fixing tape 32 such that the mounting surface M1 of each element body 2 faces upward. Then, the blasting media 34 is applied (blasted) to the element bodies 2 from a nozzle 33 installed above the element bodies 2. The blasting media 34 is, for example, particles made of zircon or alumina.

The blasting conditions can mainly set a blasting speed, an amount of blasting and a blasting area. The blasting speed is adjusted by the pressure and path of the blasting media 34. The amount of blasting is adjusted by media circulation and blasting time. The blasting area is adjusted by the shape of the nozzle 33 and the distance between the element bodies 2 and the nozzle 33.

In the blasting process, the side surface M2, the upper surface M3, the front surface M4 and the rear surface M4 of each base layer 7 are coated with the resist resin. Thus, even when the blasting media 34 blasted from the nozzle 33 wrap around the side surfaces of each element body 2, the oxide film remains on the side surface M2 and the upper surface M3 of each base layer 7 whereas the oxide film is removed from the mounting surface M1 of each base layer 7. Incidentally, an amount of removing (blasting) the oxide film from the mounting surface M1 of the base layer 7 can be set to a value or a range that enables the forming of the plating layer 9 on the mounting surface M1 of the base layer 7.

According to the above-described second embodiment, the ceramic component, which is a main component of the dielectric layers 4, is mixed in the conductive paste for the base layer. Thus, it is possible to form on each base layer 7 the oxide layer 8 that includes the oxide film of the metal used as the conductive material of the base layer 7 and an oxide containing a metal used as the co-material of the base layer 7. Therefore, it is possible to manufacture the multilayer ceramic capacitor 1A that can reduce or eliminate the possibility of peeling of the oxide layers 8 from the external electrodes 6A and 6B while suppressing an increase in the number of the manufacturing steps.

It should be noted that although a method that utilizes the blasting has been described to remove the oxide layers 8 from the mounting surfaces M1 of the external electrodes 6A and 6B in the above-described embodiment, isotropic dry etching such as plasma etching may be employed instead of the blasting, or chemical polishing such as wet etching may be employed instead of the blasting.

Third Embodiment

Figure 8:
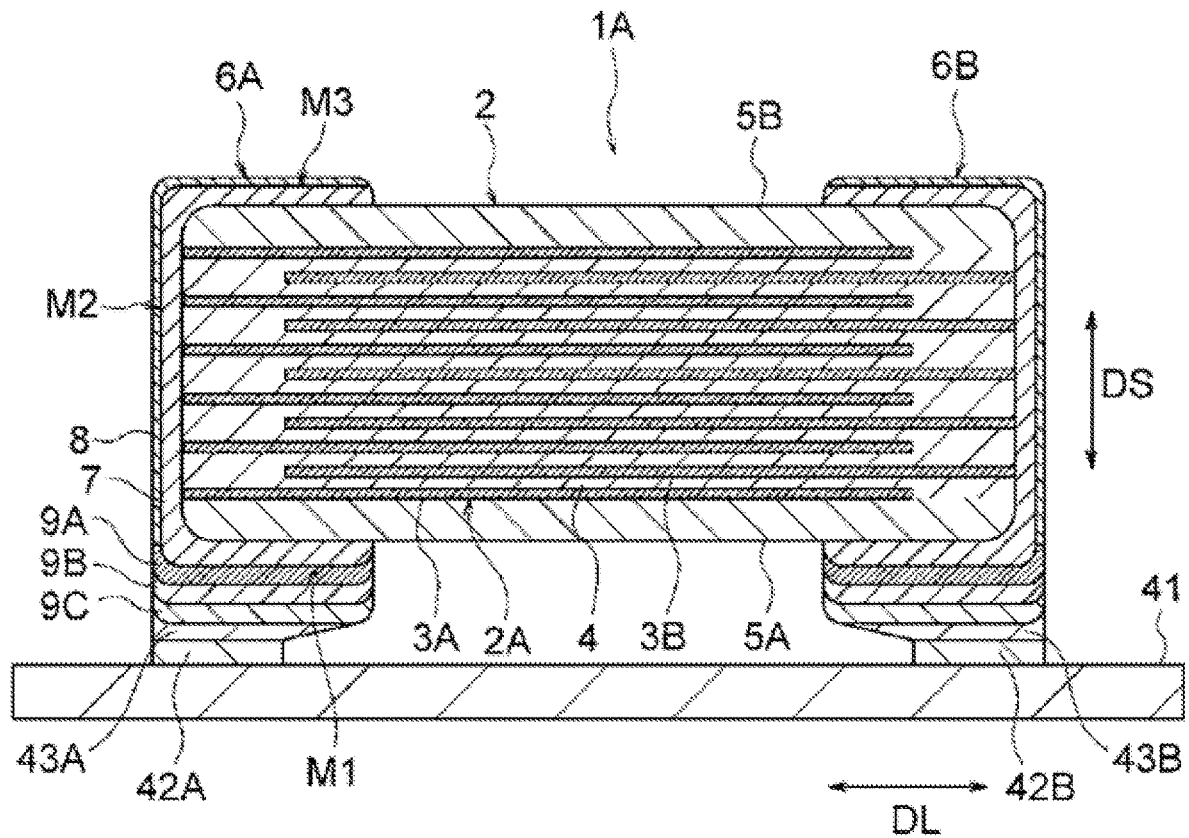
FIG. 8 is a cross-sectional view showing a configuration of a circuit board arrangement in which a multilayer ceramic capacitor is mounted on a circuit board according to a third embodiment.

FIG. 8 is a cross-sectional view showing a circuit board arrangement according to a third embodiment of the present invention. The circuit board arrangement includes a circuit board 41 and a multilayer ceramic capacitor 1A mounted on the circuit board 41.

In FIG. 8, land electrodes 42A and 42B are formed on the circuit board 41. The multilayer ceramic capacitor 1A is connected to the land electrodes 42A and 42B via solder layers 43A and 43B attached to the Sn plating layers 9C and 9C of the external electrodes 6A and 6B, respectively. The wetting up (upward movement) of the solder layer 43A to the side surface M2, the upper surface M3, the front surface M4 and the rear surface M4 of the external electrode 6A is prevented by the oxide layer 8. Similarly, the wetting up of the solder layer 43B to the side surface M2, the upper surface M3, the front surface M4 and the rear surface M4 of the external electrode 6B is prevented by the oxide layer 8. Therefore, it is possible to prevent a reduction in the interval between the electronic components due to the wetting up of the solder layers 43A and 43B to the side surfaces M2 of the external electrodes 6A and 6B. As a result, it is possible to increase the mounting density of the electronic components on the circuit board 41.

Even if the solder mounting on the circuit board 41 is performed in a reducing atmosphere in the reflow furnace, and the oxide of the metal exposed on the surface of each oxide layer 8 is reduced to the metal, the co-material of each base layer 7 remains as it is on the surface of the oxide layer 8. Therefore, it is possible to prevent the upward movement of the wet solder layer 43A to the side surface M2 and the upper surface M3 of the external electrode 6A and prevent the upward movement of the wet solder layer 43B to the side surface M2 and the upper surface M3 of the external electrode 6B.

Because the oxide layer 8 contains the co-material of the base layer 7, the oxide layer 8 can improve the heat resistance thereof. Further, because the co-material of the base layer 7 exists from the base layer 7 to the surface of the oxide layer 8, it is possible to improve the resistance to thermal history.

According to the above-described third embodiment, the oxide layer 8 is provided on the side surface M2, the upper surface M3, the front surface M4 and the rear surface M4 of each of the external electrodes 6A and 6B. Thus, it is possible to increase the mounting density of the electronic components on the circuit board 41 while improving the reliability of the multilayer ceramic capacitor 1A mounted on the circuit board 41.

Fourth Embodiment

Figure 9:
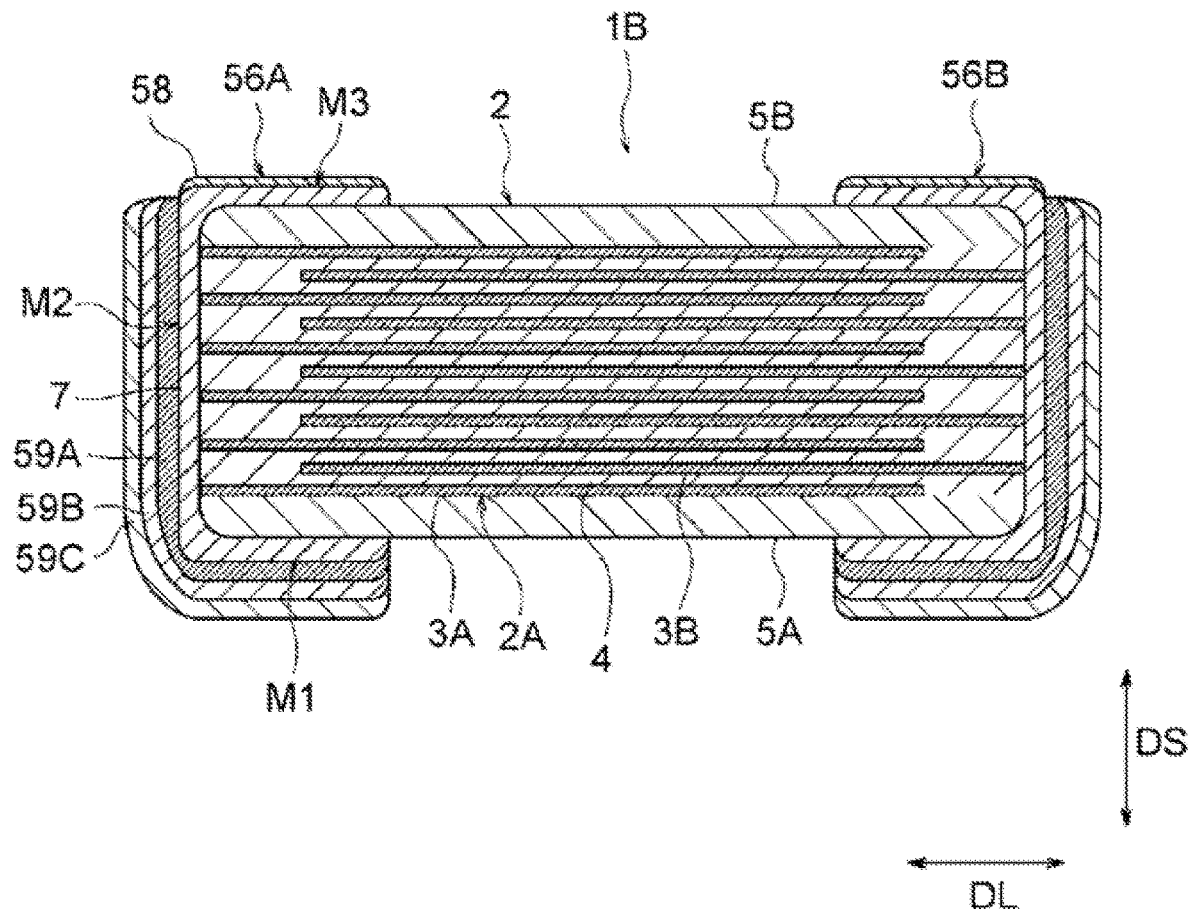
FIG. 9 is a cross-sectional view showing a configuration of a multilayer ceramic capacitor according to a fourth embodiment.

FIG. 9 is a cross-sectional view showing the configuration of a multilayer ceramic capacitor 1B according to a fourth embodiment of the present invention. In FIG. 9, the multilayer ceramic capacitor 1B includes an element body 2, and two external electrodes 56A and 56B.

The external electrodes 56A and 56B are located on opposite side surfaces of the element body 2 and separated (spaced) from each other. Each of the external electrodes 56A and 56B extends from the side surface of the element body 2 to the front surface, the rear surface, the upper surface and the lower surface of the element body 2.

Each of the external electrodes 56A and 56B includes a base layer 7 and three plating layers 59A, 59B and 59C. Each of the external electrodes 56A and 56B has a mounting surface M1, a side surface M2, an upper surface M3, a front surface M4 and a rear surface M4. The mounting surface M1 is a surface that faces a circuit board (41) on which the multilayer ceramic capacitor 1B is mounted. The top surface M3 is a surface opposite to the mounting surface M1. Although not shown in FIG. 9, the multilayer ceramic capacitor 1B is mounted on land electrodes 42A and 42B on the circuit board 41 as in the configuration shown in FIG. 8.

Surfaces other than the mounting surface M1, the side surface M2, the front surface M4 and the rear surface M4 of each of the external electrodes 56A and 56B (i.e., the upper surface M3) is coated with an oxide layer 58. The material of the oxide layer 58 is the same as the material of the oxide layer 8 shown in FIG. 1. A Cu plating layer 59A, an Ni plating layer 59B and an Sn plating layer 59C are sequentially formed on the mounting surface M1, the side surface M2, the front surface M4 and the rear surface M4 of the base layer 7 of each of the external electrodes 56A and 56B.

According to the above-described fourth embodiment, the upper surface M3 of each of the external electrodes 56A and 56B is coated with the oxide layer 58. Also, the plating layers 59A, 59B and 59C are formed on the mounting surface M1, the side surface M2, the front surface M4 and the rear surface M4 of each of the external electrodes 56A and 56B. Thus, when mounting the multilayer ceramic capacitor 1B on the circuit board 41 of FIG. 8, it is possible to allow the wet solder to move (extend) upward along the side surface M2 of each of the external electrodes 56A and 56B while preventing the wet solder from moving up onto the upper surface M3 of each of the external electrodes 56A and 56B. Therefore, even when the solder is excessively supplied on the land electrodes 42A and 42B, it is possible to suppress or prevent the solder from extending outward (laterally) from the land electrodes 42A and 42B while preventing a total height of the circuit board 41 and the multilayer ceramic capacitor 1B mounted on the circuit board 41 from exceeding a designed value. Accordingly, it is possible to narrow the distances between the electronic components mounted on the circuit board 41 while reducing the possibility of short circuiting between the electronic components mounted on the circuit board 41. This results in high-density mounting of the electronic components.

Fifth Embodiment

Figure 10:
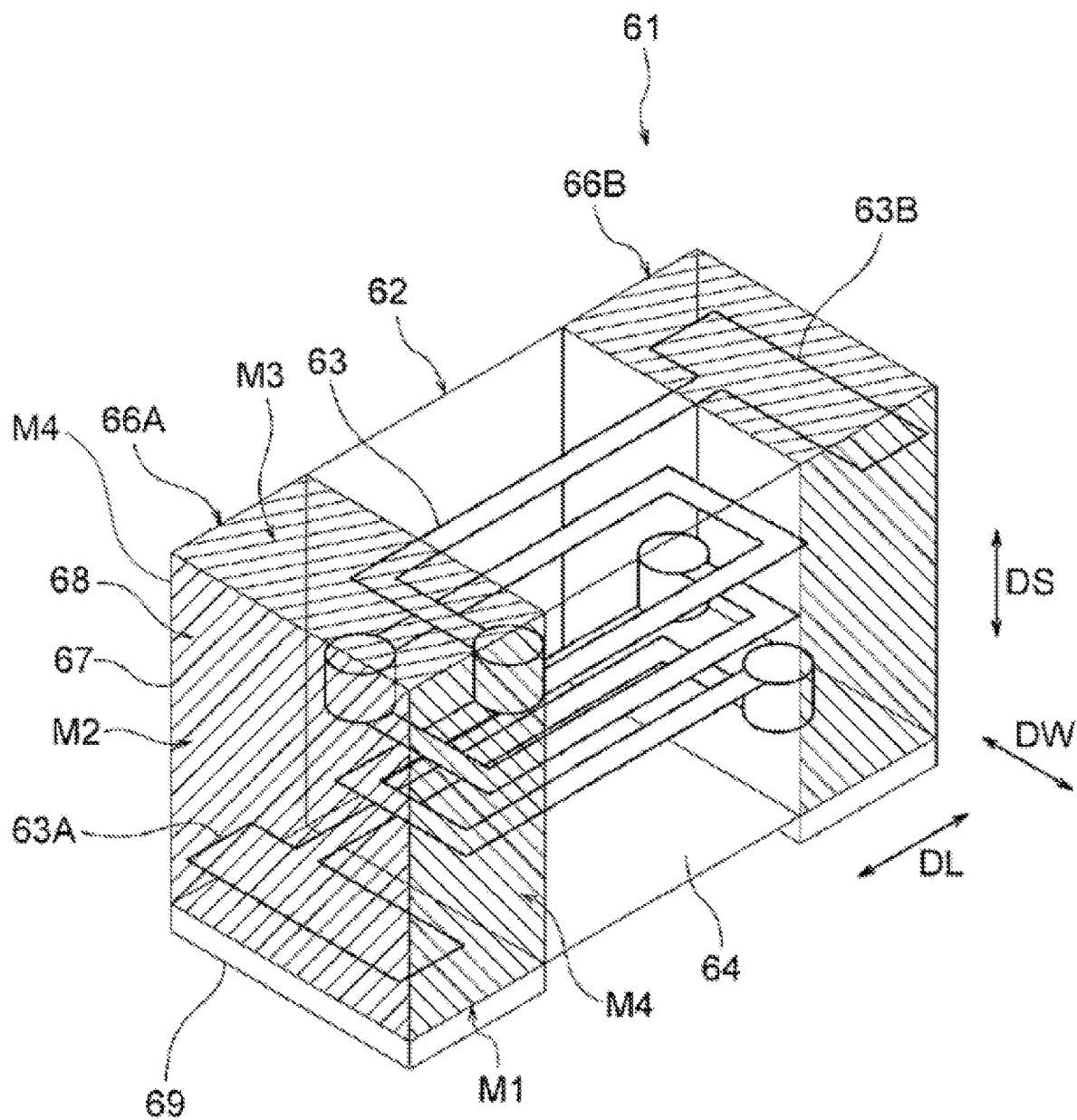
FIG. 10 is a perspective view showing a configuration of an electronic component according to a fifth embodiment.

FIG. 10 is a perspective view showing the configuration of an electronic component according to a fifth embodiment of the present invention. FIG. 10 depicts a chip inductor 61 as an example of the electronic component.

In FIG. 10, the chip inductor 61 includes an element body 62 and two external electrodes 66A and 66B. The element body 62 has a coil pattern 63, inner electrode layers 63A and 63B and a magnetic material 64. The shape of the element body 62 can be a substantially rectangular parallelepiped shape. The external electrodes 66A and 66B are located on opposite side surfaces of the element body 62 and separated from each other. Each of the external electrodes 66A and 66B extends from the associated side surface of the element body 62 toward the front surface, the rear surface, the upper surface and the lower surface of the element body.

The coil pattern 63 and the inner electrode layers 63A and 63B are covered with the magnetic material 64. However, the end portion of the inner electrode layer 63A is exposed from the magnetic material 64 on one side surface of the element body 62 and connected to the external electrode 66A. The end portion of the inner electrode layer 63B is exposed from the magnetic material 64 on the other side surface of the element body 62 and connected to the external electrode 66B.

The material of the coil pattern 63, the inner electrode layer 63A and the inner electrode layer 63B may be, for example, a metal such as Cu, Ni, Ti, Ag, Au, Pt, Pd, Ta and W or an alloy containing these metals. The magnetic material 64 is, for example, a ferrite.

Each of the external electrodes 66A and 66B includes a base layer 67 and a plating layer 69. Each of the external electrodes 66A and 66B has a mounting surface M1, a side surface M2, a top surface M3, a front surface M4 and a rear surface M4. The mounting surface M1 is a surface that faces a circuit board on which the chip inductor 61 is mounted. The top surface M3 is a surface opposite to the mounting surface M1.

The main component of the conductive material of the base layer 67 may be, for example, a metal that includes at least one of Cu, Fe, Zn, Al, Ni, Pt, Pd, Ag, Au and Sn or an alloy thereof. The base layer 67 includes a co-material. The co-material is, for example, a ceramic component which is a main component of the magnetic material 64. The base layer 67 may contain a glass component. The glass component is, for example, an oxide of Ba, Sr, Ca, Zn, Al, Si or B.

Surfaces other than the mounting surface M1 of each of the external electrodes 66A and 66B (i.e., the side surface M2, the top surface M3, the front surface M4 and the rear surface M4) are coated with an oxide layer 68. The oxide layer 68 includes an oxide film of a metal used as a conductive material of the base layer 67, and an oxide containing a metal used as the co-material of the base layer 67. The plating layer 69 is formed on the mounting surface M1 of the base layer 67 of each of the external electrodes 66A and 66B. The base layer 67, the oxide layer 68 and the plating layer 69 can be configured in a similar manner to the base layer 7, the oxide layer 8 and the plating layer 9 of FIG. 1, respectively.

According to the above-described fifth embodiment, the oxide layer 68 includes the oxide film of the metal used as the conductive material of the base layer 67 and the oxide containing the metal used for the co-material of the base layer 67, and therefore it is possible to prevent the wet solder from moving upward to those surfaces of the external electrode 66A, 66B on which the oxide layers 68 are formed. Also, it is possible to suppress or prevent the peeling of the oxide layers 68 from the external electrodes 66A and 66B.

Sixth Embodiment

Figure 11:
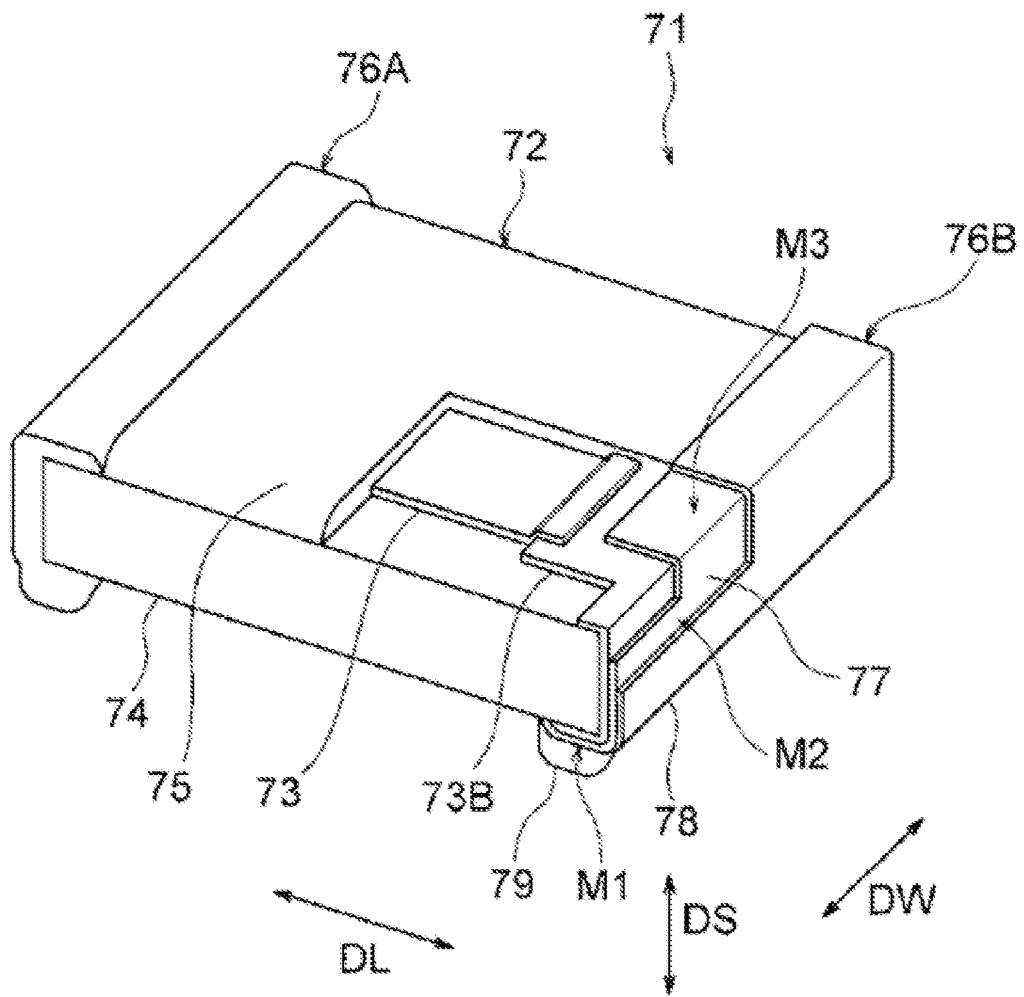
FIG. 11 is a perspective view showing a configuration of an electronic component according to a sixth embodiment.

FIG. 11 is a partially cutout perspective view of an electronic component according to a sixth embodiment of the present invention. FIG. 11 illustrates a chip resistor 71 as an example of the electronic component.

In FIG. 11, the chip resistor 71 includes an element body 72, two external electrodes 76A and 76B, and a protective film 75. The element body 72 has a resistor 73, an inner electrode layer 73B, and a substrate 74. The element body 72 may have a substantially rectangular parallelepiped shape. The external electrodes 76A and 76B are disposed on opposite side surfaces of the element body 72 and separated from each other. Each of the external electrodes 76A and 76B extends from the associated side surface of the element body 72 to the upper and lower surfaces of the element body 72.

The resistor 73 and the inner electrode layer 73B are disposed on the substrate 74 and covered with the protective film 75. One end of the resistor 73 is connected to the inner electrode layer 73B on the substrate 74. The inner electrode layer 73B is elongated to one side surface of the element body 72 and connected to the external electrode 76B. Another inner electrode layer (not shown) connected to the other end of the resistor 73 is elongated to the other side surface of the element body 72 and connected to the external electrode 76A.

The material of the resistor 73 may be selected from metals such as Ag and Pd, for example, or may be an alloy containing these metals. Alternatively, the material of the resistor 73 may be a metal oxide such as ruthenium oxide. The material of the inner electrode layer 73B may be selected from metals such as Cu, Ni, Ti, Ag, Au, Pt, Pd, Ta and W, or may be an alloy containing these metals. The material of the substrate 74 is, for example, an oxide ceramic such as alumina. The material of the protective film 75 is, for example, glass or resin.

Each of the external electrodes 76A and 76B includes a base layer 77 and a plating layer 79. Each of the external electrodes 76A and 76B has a mounting surface M1, a side surface M2, and a top surface M3. The mounting surface M1 is a surface facing a circuit board on which the chip resistor 71 is mounted. The top surface M3 is a surface opposite to the mounting surface M1.

A main component of the conductive material of the base layer 77 may be, for example, a metal or metals that include at least one of Cu, Fe, Zn, Al, Ni, Pt, Pd, Ag, Au and Sn, or an alloy containing at least one of Cu, Fe, Zn, Al, Ni, Pt, Pd, Ag, Au and Sn. The base layer 77 includes a co-material. The co-material is, for example, a ceramic component which is a main component of the substrate 74. The base layer 77 may contain a glass component. The glass component is, for example, an oxide of Ba, Sr, Ca, Zn, Al, Si or B.

Surfaces other than the mounting surface M1 of each of the external electrodes 76A and 76B (the side surface M2 and the upper surface M3) are coated with an oxide layer 78. The oxide layer 78 includes an oxide film of a metal used as the conductive material of the base layer 77, and an oxide containing a metal used as the co-material of the base layer 77. The plating layer 79 is formed on the mounting surface M1 of the base layer 77 of each of the external electrodes 76A and 76B. The base layer 77, the oxide layer 78 and the plating layer 79 can be configured similarly to the base layer 7, the oxide layer 8 and the plating layer 9 shown in FIG. 1, respectively.

According to the above-described sixth embodiment, the oxide layer 78 includes the oxide film of the metal used as the conductive material of the base layer 77 and the oxide containing the metal used as the co-material of the base layer 77. Thus, it is possible to prevent the wet solder from moving upward to those surfaces of the external electrodes 76A and 76B on which the oxide layers 78 are formed, and reduce the possibility of peeling of the oxide layers 78 from the external electrodes 76A and 76B.

It should be noted that although the electronic component described in each of the above-described embodiments has two terminals, the electronic component may have three or more terminals such as a transistor or a transformer.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. An electronic component comprising:
an element body that includes a dielectric and at least one inner electrode; and
at least one external electrode,
wherein each of the at least one external electrode includes:
a base layer connected to one or more of said at least one inner electrode and containing a metal and a first co-material mixed with the metal, the base layer being formed on a side surface of the element body and extending from the side surface to cover one or more of adjacent surfaces of the element body, the base layer thereby having a plurality of faces facing different directions,
a plating layer formed on at least one face of the base layer, and
an oxide layer formed on one or more of the faces of the base layer other than said at least one face of the base layer, the oxide layer having a surface layer made of plural kinds of oxides, the plural kinds of oxides including an oxide film of the metal of the base layer and an oxide ceramic, the oxide ceramic being distributed in the form of islands over an entire surface of the oxide layer, being exposed on the surface of the oxide layer, and puncturing the oxide film to reach the base layer, thereby serving as a strut penetrating the oxide layer and supporting the oxide layer on the base layer.

2. The electronic component according to claim 1, wherein the first co-material contained in the base layer and the oxide ceramic contained in the oxide layer have a same composition.

3. The electronic component according to claim 1, wherein a main component of the dielectric is oxide ceramic.

4. The electronic component according to claim 1, wherein the first co-material contained in the base layer and the oxide ceramic contained in the oxide layer have a same composition as a main component of the dielectric.

5. The electronic component according to claim 1,
wherein at least some of the oxide ceramic in the oxide layer is a portion of some of the first co-material in the base layer that reaches the oxide layer, thereby having a continuous structure from the base layer to the oxide layer, and
wherein the first co-material and the oxide ceramic have a single or poly- crystal structure or amorphous structure therein.

6. The electronic component according to claim 1, wherein the metal of the base layer is present in the form of crystalline or amorphous particles and the first co-material is also present in the form of crystalline or amorphous particles such that the particles of the metal of the base layer are mixedly present with the particles of the first co-material.

7. The electronic component according to claim 1, wherein a main component of the dielectric is barium titanate.

8. The electronic component according to claim 1, wherein the plating layer formed on at least a bottom face of the base layer, and the oxide layer is provided on a face of the base layer that is on the side surface of the element body and on at least a portion of a top face of the base layer that is opposite to the bottom face on which the plating layer is formed.

9. The electronic component according to claim 1, wherein a ratio of the oxide ceramic at a surface of the oxide layer is in a range from 20 at % to 75 at %.

10. The electronic component according to claim 1, wherein the metal of the base layer is a metal or alloy containing at least one of Cu, Fe, Zn, Al, Ni, Pt, Pd, Ag, Au and Sn.

11. The electronic component according to claim 1, wherein the first co-material includes at least one of barium titanate, strontium titanate, calcium titanate, magnesium titanate, barium strontium titanate, barium calcium titanate, calcium zirconate, barium zirconate, calcium titanate zirconate and titanium oxide.

12. The electronic component according to claim 1, wherein the oxide layer includes nickel oxide and barium titanate at a surface of the oxide layer.

13. The electronic component of claim 12, wherein the oxide layer further includes a compound containing nickel, magnesium, and oxygen at the surface of the oxide layer.

14. The electronic component according to claim 1,
wherein the element body has a laminate, in which at least one first inner electrode layer and at least one second inner electrode layer, as said at least one inner electrode, are alternately laminated via the dielectric,
said at least one external electrode includes a first external electrode and a second external electrode provided on opposite side surfaces of the laminate such that the first external electrode is spaced from the second external electrode,
said at least one first inner electrode layer is connected to the first external electrode, and
said at least one second inner electrode layer is connected to the second external electrode.

15. The electronic component according to claim 14, wherein the plating layer is formed on at least a bottom face of the base layer, and said at least one first inner electrode layer and said at least one second inner electrode layer are alternately laminated in a direction perpendicular to the bottom face of the base layer on which the plating layer is formed.

16. A circuit board arrangement comprising:
a circuit board; and
the electronic component as set forth in claim 1, mounted on the circuit board,
the electronic component being connected to the circuit board via a solder layer attached to the plating layer.

17. The electronic component according to claim 1, wherein the oxide ceramic is made by a plurality of particles collected to a size of about µm to 40 µm.

* * * * *